(12) United States Patent
Jiang

(10) Patent No.: US 10,881,009 B2
(45) Date of Patent: Dec. 29, 2020

(54) DISPLAY SCREEN ASSEMBLY AND MOBILE TERMINAL

(71) Applicant: VIVO MOBILE COMMUNICATION CO., LTD., Chang'an Dongguan (CN)

(72) Inventor: Liping Jiang, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 0 days.

(21) Appl. No.: 16/488,369

(22) PCT Filed: Dec. 29, 2017

(86) PCT No.: PCT/CN2017/119849
§ 371 (c)(1),
(2) Date: Aug. 23, 2019

(87) PCT Pub. No.: WO2018/153165
PCT Pub. Date: Aug. 30, 2018

(65) Prior Publication Data
US 2020/0253063 A1    Aug. 6, 2020

(30) Foreign Application Priority Data

Feb. 23, 2017   (CN) .......................... 2017 1 0098426

(51) Int. Cl.
*H05K 5/00* (2006.01)
*H05K 5/02* (2006.01)
*H04M 1/02* (2006.01)

(52) U.S. Cl.
CPC ........ *H05K 5/0017* (2013.01); *H04M 1/0237* (2013.01); *H04M 1/0268* (2013.01); *H05K 5/0217* (2013.01)

(58) Field of Classification Search
CPC . H05K 5/0017; H05K 5/0217; H04M 1/0237; H04M 1/0268; H04M 1/0235; G06F 1/1624; G06F 1/1652
See application file for complete search history.

(56) References Cited

U.S. PATENT DOCUMENTS

2008/0144265 A1   6/2008 Aoki
2008/0167095 A1   7/2008 Kim et al.
(Continued)

FOREIGN PATENT DOCUMENTS

CN    101217579 A    7/2008
CN    102123187 A    7/2011
(Continued)

OTHER PUBLICATIONS

1st Chinese Office Action for Chinese Application No. 201710098426.9, dated Mar. 23, 2018 (Mar. 23, 2018)—9 pages (English translation—6 pages).

(Continued)

*Primary Examiner* — Abhishek M Rathod
(74) *Attorney, Agent, or Firm* — Culhane Meadows PLLC; Stephen J. Weed

(57) ABSTRACT

A display screen assembly and a mobile terminal are provided by the embodiments of the present disclosure. The display screen assembly includes the display screen assembly. The display screen assembly includes a display screen and at least one first rotating shaft. The display screen includes a first display region and a second display region. The second display region is provided on at least one side of two opposite sides of the first display region. The second display region is a flexible region. Each second display region is provided corresponding to the first rotating shaft, each second display region is fixed on the corresponding (Continued)

first rotating shaft, and each second display region is enabled to be curled around the corresponding first rotating shaft.

7 Claims, 5 Drawing Sheets

(56) References Cited

U.S. PATENT DOCUMENTS

| | | | | |
|---|---|---|---|---|
| 2011/0176260 | A1* | 7/2011 | Walters | G06F 1/1641 |
| | | | | 361/679.01 |
| 2012/0212433 | A1* | 8/2012 | Lee | G06F 1/1652 |
| | | | | 345/173 |
| 2013/0058063 | A1* | 3/2013 | O'Brien | G06F 1/1652 |
| | | | | 361/807 |
| 2014/0194165 | A1 | 7/2014 | Hwang | |
| 2014/0213324 | A1 | 7/2014 | Tan et al. | |
| 2014/0380186 | A1* | 12/2014 | Kim | G06F 1/1652 |
| | | | | 715/746 |
| 2016/0100478 | A1 | 4/2016 | Lee | |
| 2016/0154433 | A1 | 6/2016 | Su et al. | |
| 2016/0366772 | A1* | 12/2016 | Choi | G06F 1/1652 |
| 2017/0280570 | A1* | 9/2017 | Li | G06F 1/1652 |
| 2018/0014417 | A1* | 1/2018 | Seo | H05K 1/189 |
| 2018/0049328 | A1* | 2/2018 | Choi | G06F 1/1601 |
| 2018/0098440 | A1* | 4/2018 | Choi | G02F 1/133305 |
| 2018/0103550 | A1* | 4/2018 | Seo | H05K 5/0017 |
| 2018/0103552 | A1* | 4/2018 | Seo | G09F 9/301 |

FOREIGN PATENT DOCUMENTS

| | | | |
|---|---|---|---|
| CN | 102902308 | A | 1/2013 |
| CN | 202855256 | U | 4/2013 |
| CN | 103929530 | A | 7/2014 |
| CN | 205194238 | U | 4/2016 |
| CN | 205264268 | U | 5/2016 |
| CN | 105702166 | A | 6/2016 |
| CN | 105786124 | A | 7/2016 |
| CN | 205522696 | U | 8/2016 |
| CN | 106023813 | A | 10/2016 |
| CN | 106713554 | A | 5/2017 |
| EP | 3088986 | A1 | 11/2016 |
| KR | 100818170 | B1 | 4/2008 |

OTHER PUBLICATIONS

2nd Chinese Office Action for Chinese Application No. 201710098426. 9, dated Jun. 11, 2018 (Jun. 11, 2018)—11 pages (English translation—15 pages).

Chinese Search Report for CN Application No. 201710098426.9 dated Aug. 11, 2019 (Aug. 11, 2019)—7 pages (English translation—4 pages).

Extended European Search Report for European Application No. 17898042.1, dated Nov. 19, 2019 (Nov. 19, 2019)—9 pages.

International Search Report and Written Opinion for International Application No. PCT/CN2017/119849, dated Sep. 6, 2019 (Sep. 6, 2019)—10 pages (English translation—7 pages).

* cited by examiner

DISPLAY SCREEN ASSEMBLY AND MOBILE TERMINAL

CROSS-REFERENCE TO RELATED APPLICATION

This application is the U.S. national phase of PCT Application No. PCT/CN2017/119849 filed on Dec. 29, 2017, which claims priority to Chinese Patent Application No. 201710098426.9 filed on Feb. 23, 2017, the disclosures of which are incorporated in their entirety by reference herein.

TECHNICAL FIELD

The present disclosure relates to the field of communication technology, in particular to a display screen assembly and a mobile terminal.

BACKGROUND

With the development of science and technology, requirements of users for the mobile terminal are gradually diversified. The users also have different requirements for the display screen size of the mobile terminal according to different operating environments or experience requirements. In order to satisfy the requirements of the users for more beautiful visual experience, the display screen having a large-screen has become a development trend in the future. However, with pursuing the display screen having a large-screen, an overall size of the mobile terminal is also increasing, which reduces a convenience for the users carrying the product. Thus, when the mobile terminal adopts the display screen having a lame-screen, there is a problem that the display screen becomes not portable because the display screen cannot be shrunk.

SUMMARY

A display screen assembly and a mobile terminal are provided by the embodiments of the present disclosure to solve the problem that the mobile terminal with a large-screen in the related art has no portability because the display screen cannot be shrunk.

In a first aspect, the display screen assembly for a mobile terminal provided by the embodiments of the present disclosure includes a display screen and at least one first rotating shaft. The display screen includes a first display region and a second display region. The second display region is provided on at least one side of two opposite sides of the first display region. The second display region is a flexible region. The second display region is positioned corresponding to the first rotating shaft, the second display region is fixed on the corresponding first rotating shaft, and the second display region is enabled to be curled around the corresponding first rotating shaft.

In a second aspect, the mobile terminal provided by the embodiments of the present disclosure includes the display screen assembly. The display screen assembly includes a display screen and at least one first rotating shaft. The display screen includes a first display region and a second display region. The second display region is provided on at least one side of two opposite sides of the first display region. The second display region is a flexible region. The second display region is positioned corresponding to the first rotating shaft, the second display region is fixed on the corresponding first rotating shaft, and the second display region is enabled to be curled around the corresponding first rotating shaft.

In some embodiments of the present disclosure, the display screen can be divided into a first display region which is fixed and a second display region which can be curled, so that the display screen can be enlarged or shrunk. In this way, the users can freely adjust the size of the display screen according to their requirements. Thus, the requirements of the users for the size of the display screen in different scenes can be satisfied, and the portability of the mobile terminal is not affected.

BRIEF DESCRIPTION OF THE DRAWINGS

In order to more clearly illustrate the technical solutions of the embodiments of the present disclosure, the drawings to be used in the description of the embodiments of the present disclosure will be described briefly below. Obviously, the drawings in the following description are merely some embodiments of the present disclosure. For those skilled in the art, other drawings can also be obtained according to these drawings without the inventive labor.

DETAILED DESCRIPTION

Technical solutions of the embodiments of the present disclosure will be clearly and completely described below in conjunction with the drawings of the embodiments of the present disclosure. It is apparent that the described embodiments are a part of the embodiments of the present disclosure, rather than all of them. Based on the described embodiments of the present disclosure, other embodiments obtained by those skilled in the art without creative effort shall fall within the protective scope of the disclosure.

Figure 1:
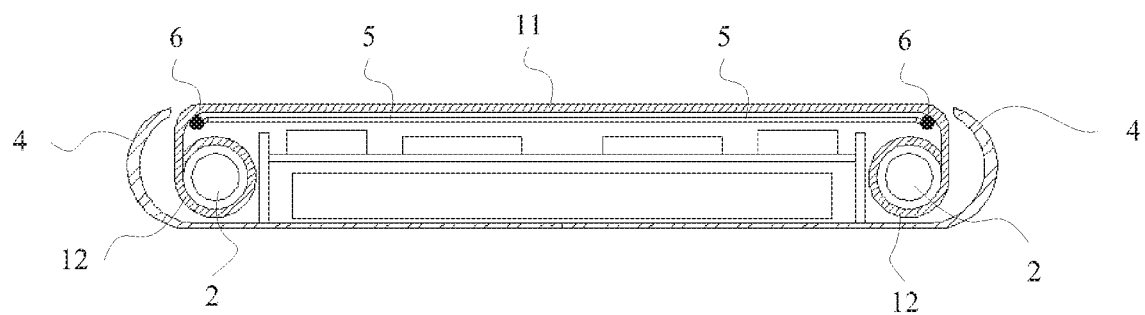
FIG. 1 is a structural schematic diagram of the display screen assembly according to some embodiment of the present disclosure.

As shown in FIG. 1, the display screen assembly includes the display screen 1 and two first rotating shafts 2. The display screen 1 includes a first display region 11 and two second display regions 12; the two second display regions 12 are located on two opposite sides of the first display region 11 respectively, and the two second display regions 12 are flexible regions. Each of the second display regions 12 is arranged corresponding to one of the first rotating shafts 2; each of the second display regions 12 is fixed on the corresponding first rotating shaft 2; and each of the second display regions 12 can be curled around the corresponding first rotating shaft 2.

Figure 2:
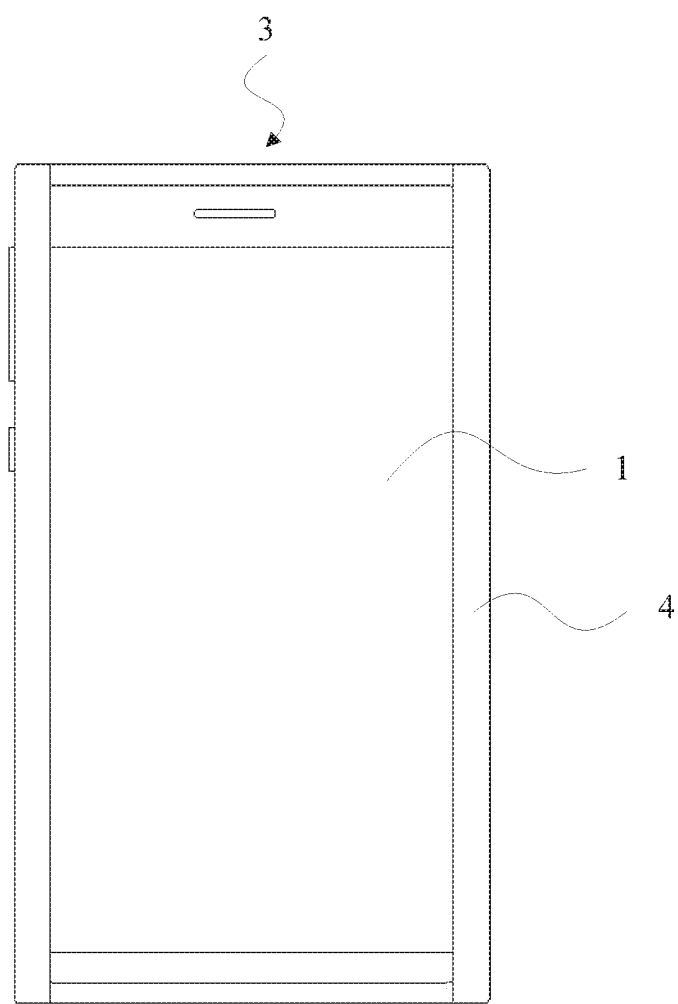
FIG. 2 is a structural schematic diagram of the mobile terminal according to some embodiments of the present disclosure.

As shown in FIG. 2, the display screen assembly according to some embodiments of the present disclosure may be applied to the mobile terminal 3, in which the display screen 1 can be the display screen of the mobile terminal 3.

When the display screen assembly according to some embodiments of the present disclosure is assembled with the mobile terminal 3, the first display region 11 of the display screen 1 can be fixed and laid on the mobile terminal 3. The second display regions 12 on both two sides of the first display region 11 may be curled around the corresponding first rotating shafts 2 when are not used. The first rotating shafts 2 can be fixed on the mobile terminal 3 by a connecting mechanism, such connecting mechanism can be a strap, a hook or a connector, or the like, and is not limited thereto.

Thus, when the mobile terminal 3 is not used, by curling the second display regions 12 around the first rotating shafts 2 respectively, the overall size of the mobile terminal 3 is not increased, which is advantageous for ensuring the portability of the mobile terminal 3.

Figure 3:
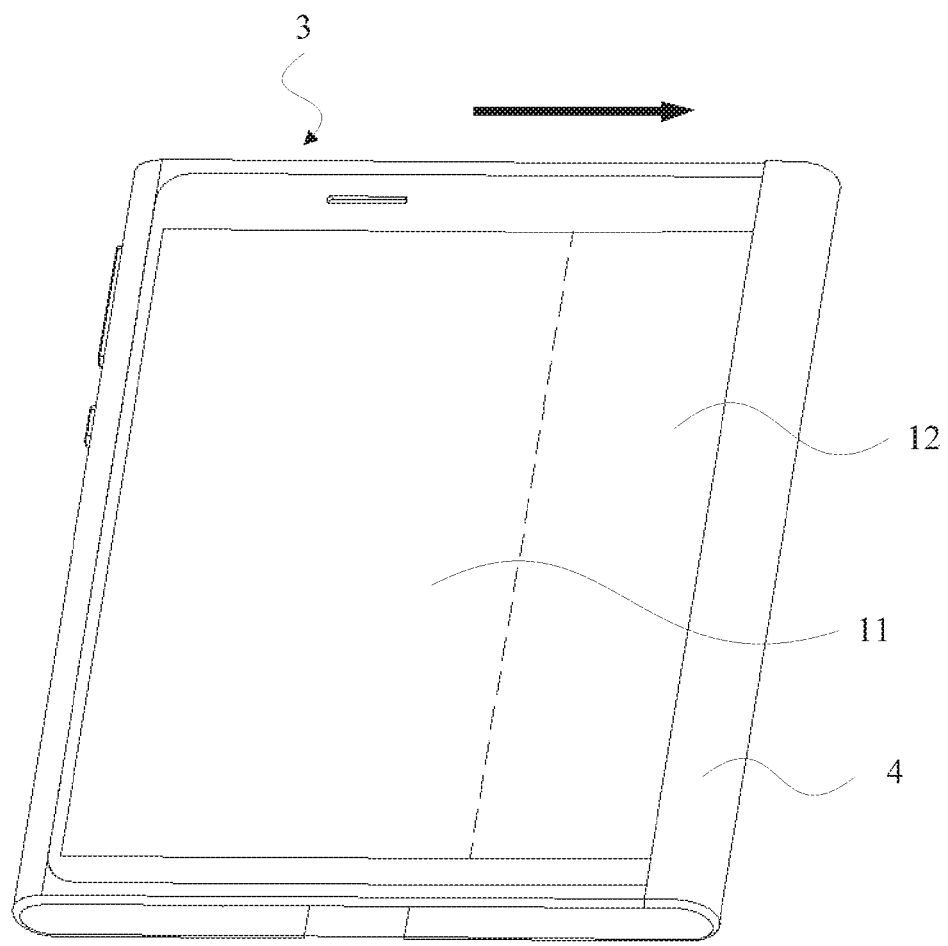
FIG. 3 is another structural schematic diagram of the mobile terminal according to some embodiments of the present disclosure.
Figure 4:
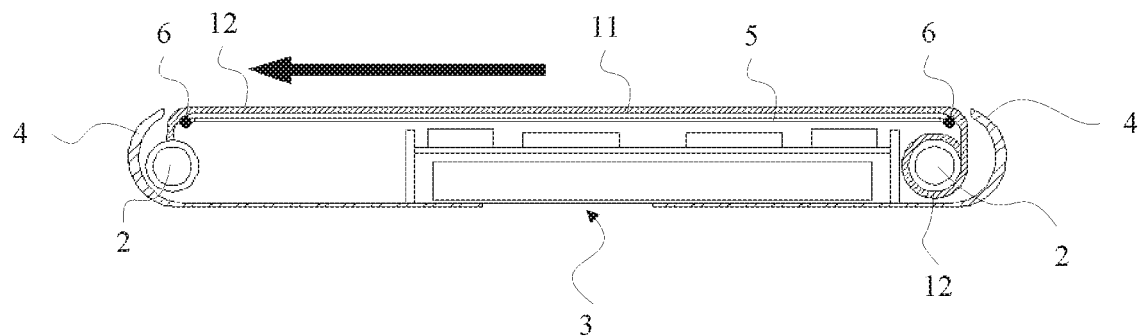
FIG. 4 is a structural schematic diagram of the display screen extended to the left side according to some embodiments of the present disclosure.
Figure 5:
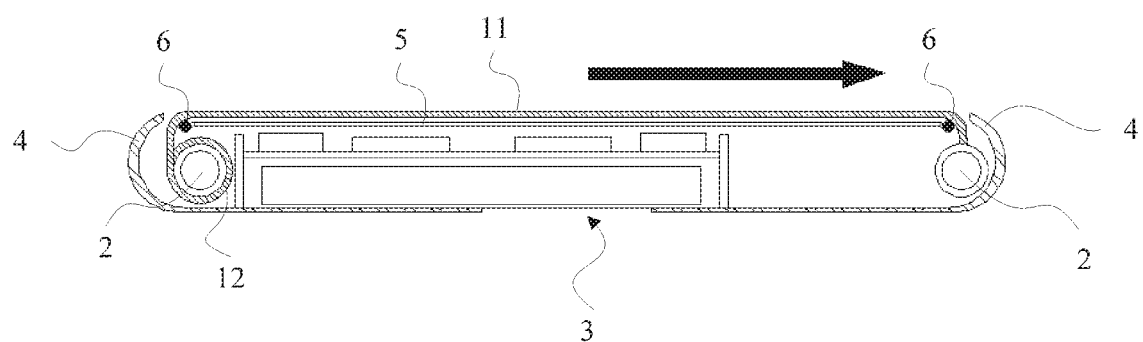
FIG. 5 is a structural schematic diagram of the display screen extended to the right side according to some embodiments of the present disclosure.
Figure 6:
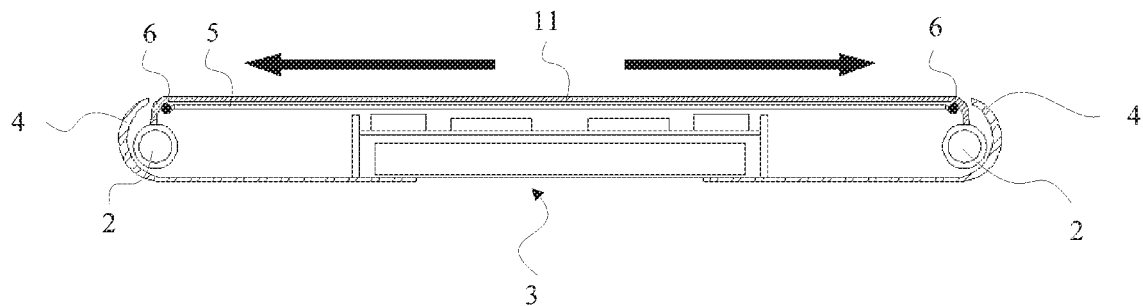
FIG. 6 is a structural schematic diagram of the display screen extended to both the left and the right sides according to some embodiments of the present disclosure.

As shown in FIG. 3, when the users need the large-screen, for example, in a scene of playing a video, reading an e-book or a video conference, the first rotating shafts 2 can be removed from the mobile terminal 3 and the second display regions 12 curled on the first rotating shafts 2 can be extended to extend the second display regions 12 toward two side portions of the mobile terminal 3. As shown in FIG. 4 and FIG. 5, the users may choose to extend only one of the second display regions 12; as shown in FIG. 6, the users may also choose to extend both of second display regions 12 at the same time; and the users may also choose to extend any one or two second display regions 12 to any extent.

In some embodiments of the present disclosure, the number of the second display region 12 is not limited to two, and may be one. In the case that the number of the second display region 12 is one, the second display region 12 may be arranged on either side of the first display region. Further, in the case that the number of the second display region 12 is one, the number of the first rotating shaft 2 may also be one accordingly.

In some embodiments of the present disclosure, not only the second display regions 12 can be flexible regions, the first display region 11 may also be a flexible region. In the case that the first display region 11 is a flexible region, the display screen 1 may be an integrally formed flexible display screen.

In some embodiments of the present disclosure, the display screen can be divided into a first display region which is fixed and a second display region which can be curled, so that the display screen can be enlarged or shrunk. In this way, the users can freely adjust the size of the display screen according to their requirements. Thus, the requirements of the users for the size of the display screen in different scenes can be satisfied, and the portability of the mobile terminal is not affected.

As shown in FIG. 1 and FIG. 2, the display screen assembly for the mobile terminal 3 includes a display screen 1, two first rotating shafts 2 and two drawers 4. The two second display regions 12 are located on two opposite sides of the first display region 11 respectively. The two second display regions 12 are the flexible regions. Each of the two second display regions 12 is positioned corresponding to one of the first rotating shafts 2. Each of the second display regions 12 is fixed on the corresponding first rotating shaft 2. Each of the second display regions 12 is enabled to be curled around the corresponding first rotating shaft 2. Each of the first rotating shafts 2 is positioned corresponding to one of the drawers 4. Both the two drawers 4 are slidably coupled to a housing of the mobile terminal 3. Each of the drawers 4 is connected to both two ends of the corresponding first rotating shaft 2. Each of the drawers 4 is used to control the corresponding second display regions 12 to be extended or curled.

As shown in FIG. 3, in some embodiments of the present disclosure, the drawers 4 can be used to realize the connection between the mobile terminal 3 and the first rotating shafts 2. When the drawers 4 slides relative to the mobile terminal 3, the first rotating shafts 2 can move as the drawer 4 is sliding, so that the first rotating shafts 2 can get close to or away from the mobile terminal 3. Thus, the second display regions 12 curled on the first rotating shafts 2 can be extended or curled.

In some embodiments of the present disclosure, when the display screen assembly is assembled with the mobile terminal 3, the first display region 11 of the display screen 1 can be laid on the mobile terminal 3 in a fixed manner. The second display regions 12 on both two sides of the first display region 11, when not used, may be curled around the corresponding first rotating shafts 2. The first rotating shafts 2 can be fixed on the mobile terminal 3 by the drawers 4.

Thus, as shown in FIG. 1 and FIG. 2, when the mobile terminal 3 is not used, the drawers 4 can be completely pulled in the housing of the mobile terminal 3, so that the second display regions 12 are curled on the first rotating shaft 2. The overall size of the mobile terminal 3 is not increased, which is advantageous for ensuring the portability of the mobile terminal 3.

As shown in FIG. 3, when the users need the large-screen, for example, in a scene of playing a video, reading an e-book or a video conference, the drawer 4 can be extended toward the side far away from the mobile terminal 3, so that the second display regions 12 curled on the first rotating shaft 2 can be extended, and the second display regions 12 are extended toward the side portions of the mobile terminal 3.

Thus, in some embodiments of the present disclosure, the drawers 4 is used to control the second display regions 12 to be extended or curled, so that convenient and quick operations can be provided for adjusting the size of the display screen 1.

In some embodiments of the present disclosure, as shown in FIG. 4 and FIG. 5, the users may choose to extend only one of the second display regions 12; as shown in FIG. 6, the users may also choose to extend two second display regions 12 at the same time; and the users may also choose to extend any on two second display regions 12 to any extent.

In some embodiments of the present disclosure, the number of the second display region 12 is not limited to two, and may be one. In the case that the number of the second display region 12 is one, the second display region 12 may be arranged on either side of the first display region. Further, in the case that the number of the second display region 12 is one, the number of the first rotating shaft 2 may also be one accordingly.

In some embodiments of the present disclosure, the first display region 11 may also be a flexible region in addition to the second display regions 12 being the flexible regions. In the case that the first display region 11 is a flexible region, the display screen 1 may be an integrally formed flexible display screen.

Figure 7:
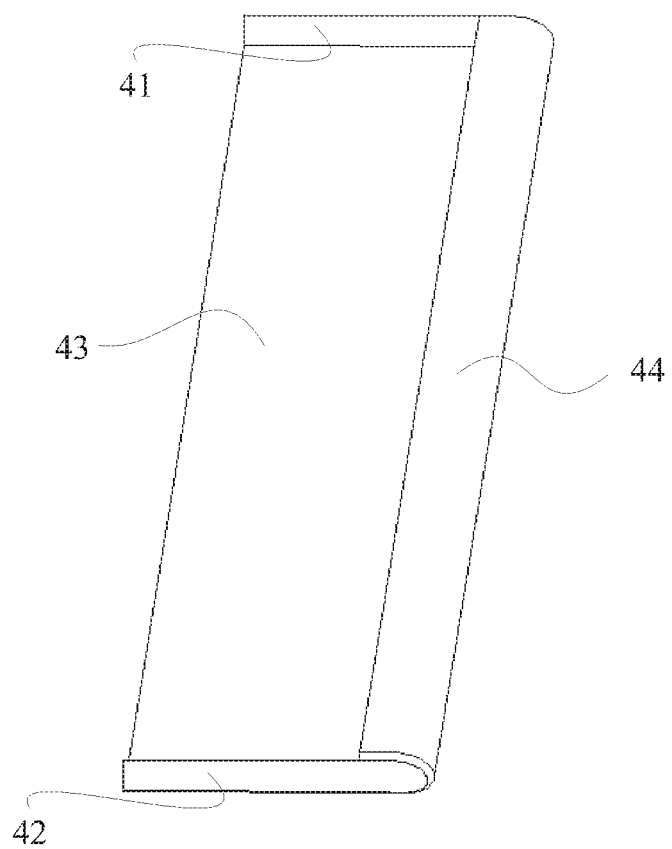
FIG. 7 is a structural schematic diagram of a drawer according to some embodiments of the present disclosure.
Figure 8:
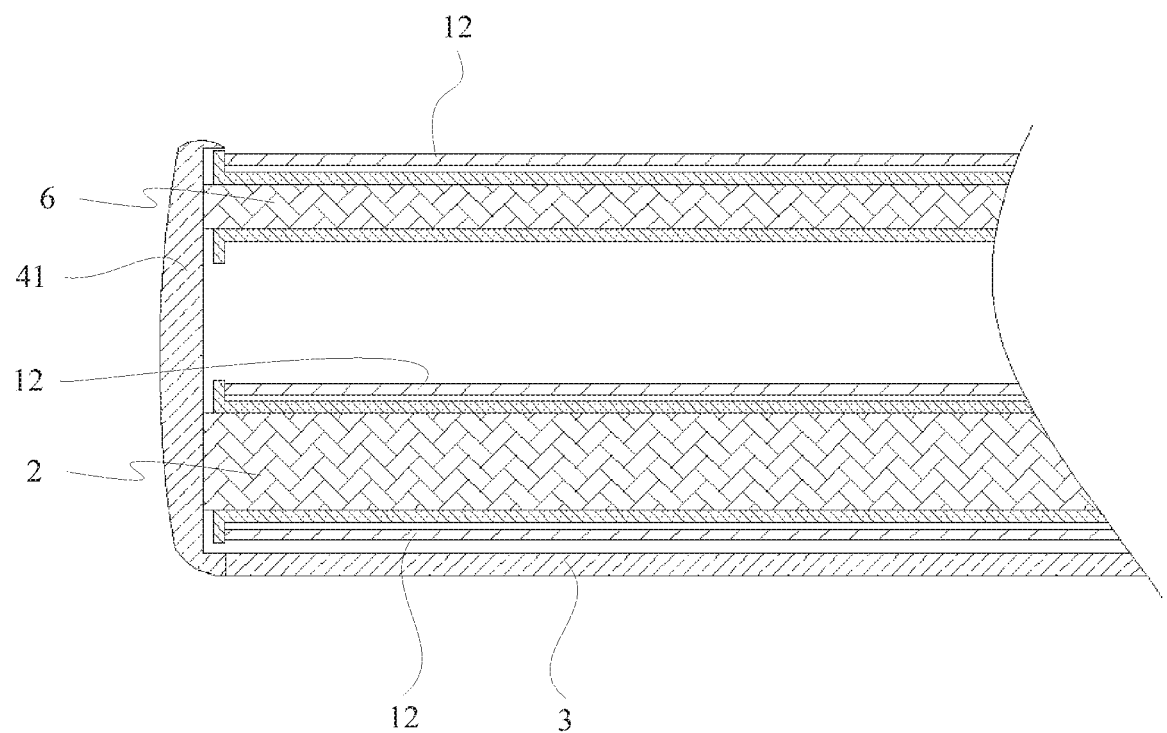
FIG. 8 is a schematic diagram showing a connection between the drawer and a rotating shaft according to some embodiments of the present disclosure.

Optionally, as shown in FIG. 7 and FIG. 8, the drawer 4 includes a first side wall 41 and a second side wall 42 parallel to each other, and a bottom wall 43 connecting the first side wall 41 and the second side wall 42. The first side wall 41 and the second side wall 42 are located on two sides of the first rotating shaft 2 in an axial direction, and are connected to the ends of the first rotating shaft 2 respectively.

In some embodiments of the present disclosure, there are various ways for the drawer 4 to be slidably connected to the housing of the mobile terminal 3. For example, the first side wall 41 or the second side wall 42 of the drawer 4 may be provided with a slidable mechanism (such as a chute or a slide rail, etc.) that cooperates with the housing of the mobile terminal 3; or the first side wall 41 and the second side wall 42 of the drawer 4 may be provided with slidable mechanisms that cooperates with the housing of the mobile terminal 3; or the bottom wall 43 of the drawer 4 may be provided with slidable mechanisms that cooperates with the housing of the mobile terminal 3; and so on.

In addition, the drawer 4 may not include the bottom wall 43, that is, the drawer 4 only includes the first side wall 41 and the second side wall 42. However, while the users pulling or pushing the drawer 4, if a force is applied to the bottom wall 43, the drawer 4 will be drawn much evenly, so that the bottom wall 43 has a large pressed area and the operation is more convenient and quick for users. Accordingly, in some embodiments of the present disclosure, the drawer 4 includes the bottom wall 43.

Optionally, as shown in FIG. 7, the drawer 4 further includes a third side wall 44 connecting the first side wall 41, the second side wall 42 and the bottom wall 43, the third side wall 44 has a curved surface, and the curved surface of the third side wall 44 forms an accommodating space to cover the first rotating shaft 2.

For the mobile terminal, the display screen is a main window for the interaction between the user and the mobile terminal, so a protection of the display screen is particularly important. If the second display region 12 curled around the first rotating shaft 2 is exposed to the outside environment, on the one hand, the overall visual effect of the mobile terminal may be affected; on the other hand, the second display region 12 may be damaged due to an external force.

Thus, in some embodiments of the present disclosure, the drawer 4 further includes the third side wall 44 with a curved surface. The first rotating shaft 2 and the second display region 12 curled around the first rotating shaft 2 are covered by the third side wall 44. When the second display region 12 is not used, the second display region 12 can be hidden. In this way, not only the overall visual effect of the mobile terminal can be improved, but also the beneficial effect of protecting the second display region 12 can be achieved.

Optionally, as shown in FIG. 1 and FIG. 4 to FIG. 6, the display screen assembly further includes two substrates 5 arranged on the mobile terminal 3 for laying the display screen 1. The two substrates 5 are slidably connected with each other. At least one of the substrates 5 is connected to a corresponding side wall of the drawer 4.

When the display screen 1 is enlarged, that is, when the second display region 12 is extended, since the second display region 12 is a flexible region, if there is no support plane below the second display region 12, a middle portion of the second display region 12 may drop due to the gravity, so there is a possibility of affecting an overall display effect of the display screen 1.

In order to solve the above problem, in some embodiments of the present disclosure, the two slide-connected substrates 5 which are slidably connected to each other for laying the display screen 1 are arranged on the mobile terminal 3. Thus, when the drawer 4 is pulled away from the mobile terminal 3, the second display region 12 is extended in synchronization with the substrates 5, so that the bottom of the display screen 1 is always supported by the substrates 5.

Figure 9:
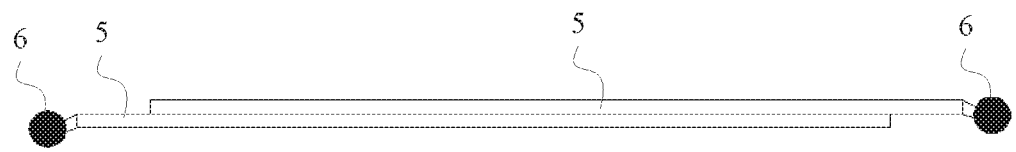
FIG. 9 is a structural schematic diagram showing two substrates stacked on each other according to some embodiments of the present disclosure.
Figure 10:
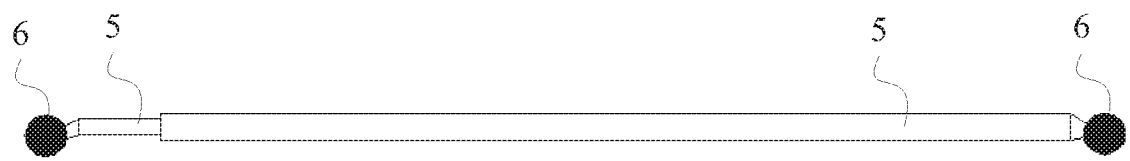
FIG. 10 is a structural schematic diagram showing two substrates nested together according to some embodiments of the present disclosure

In addition, there are various ways for the substrates 5 to be slidably connected between each other. The first example is shown in FIG. 9, in which two substrates 5 are stacked on each other. A sliding mechanism, such as the chute or the slide rail, may be arranged on contacting surfaces of the two substrates 5. The second example is shown in FIG. 10, in which one substrate 5 has a cavity, the other substrate 5 is embedded in the cavity, and the sliding mechanism, such as the chute or the slide rail, may be arranged on the contacting surfaces of the two substrates 5.

Optionally, as shown in FIG. 1, FIG. 4 to FIG. 6 and FIG. 8, the display screen assembly further includes second rotating shafts 6 arranged on the substrates 5. Two ends of each second rotating shaft 6 are connected to a corresponding one of the first side wall 41 and the second side wall 42 of the drawer 4 respectively; the second display region 12 is in contact with a side wall of the second rotating shaft 6.

When the drawer 4 is pulled or pushed, since the second display region 12 is a flexible region and the second display region 12 is contacted with edges of the substrates 5 to generate a frictional force, it is easy to damage the second display region 12.

In view of above, in some embodiments of the present disclosure, the second rotating shaft 6 is arranged on the substrates 5, so that the contact between the second display region 12 and the edges of the substrate 5 become a rolling contact. The friction force between the second display region 12 and the edges of the substrates 5 can be reduced greatly, thereby obtaining the beneficial effect of protecting the second display region 12. Further, the second display region 12 can be extended or curled more slickly and smoothly.

In some embodiments of the present disclosure, the display screen can be divided into a first display region which is fixed and a second display region which can be curled, so that the display screen can be enlarged or shrunk. In this way, the users can freely adjust the size of the display screen according to their requirements. Thus, the requirements of the users for the size of the display screen in different scenes can be satisfied, and the portability of the mobile terminal is not affected.

A mobile terminal is provided by some embodiments of the present disclosure, the mobile terminal includes the above display screen assembly.

The mobile terminal may include: a mobile phone, a tablet compute e-book reader, an MP3 player, an MP4 player, a digital camera, a laptop portable computer, a car computer, a smart TV or a wearable device.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A display screen assembly for a mobile terminal, comprising:
   a display screen, and
   at least one first rotating shaft,
   wherein the display screen comprises a first display region and a second display region, the second display region is provided on at least one side of two opposite sides of the first display region, the second display region is a flexible region; the second display region is provided corresponding to the first rotating shaft, the second display region is fixed on the corresponding first rotating shaft, and the second display region is enabled to be curled around the corresponding first rotating shaft;
   the display screen assembly further comprising at least one drawer provided corresponding to the at least one first rotating shaft, wherein each drawer and a housing of the mobile terminal being slidably connected, and each drawer is connected to two ends of the corresponding first rotating shaft so as to control the corresponding second display region to be extended or curled, wherein the drawer comprises a first side wall and a second side wall that are parallel to each other, and a bottom wall connecting the first side wall and the second side wall; the first side wall and the second side wall are located on two sides of the first rotating shaft in an axial direction and are connected to two ends of the first rotating shaft respectively;
   the display screen assembly further comprising two substrates provided on the mobile terminal for laving the display screen, wherein the two substrates are slidably connected with each other, and at least one of the substrates is connected to one of the first side wall and the second side wall of the drawer;
   the display screen assembly further comprising a second rotating shaft provided on the substrates, wherein two ends of the second rotating shaft are connected to the first side wall and the second side wall of the drawer respectively, the second display region is in contact with a side wall of the second rotating shaft.

2. The display screen assembly according to claim 1, wherein
   the drawer further comprises a third side wall connecting the first side wall, the second side wall and the bottom wall, the third side wall has a curved surface which forms an accommodating space to cover the first rotating shaft.

3. The display screen assembly according to claim 2, wherein
   the first side wall and the second side wall are slidably connected to the housing of the mobile terminal respectively.

4. The display screen assembly according to claim 1, wherein
   the first side wall and the second side wall are slidably connected to the housing of the mobile terminal respectively.

5. The display screen assembly according to claim 1, wherein,
   the display screen is a flexible display screen which is integrally formed.

6. The display screen assembly according to claim 1, wherein,
   the display screen comprises two second display regions.

7. A mobile terminal, comprising the display screen assembly according to claim 1.

* * * * *